United States Patent
Tamura

[11] Patent Number: 5,940,722
[45] Date of Patent: Aug. 17, 1999

[54] METHOD OF MANUFACTURING A SEMICONDUCTOR COMPRISING AN OXYGEN-CONTAINING SILICON WAFER

[75] Inventor: Naoyoshi Tamura, Kawasaki, Japan

[73] Assignee: Fujitsu Limited, Kanagawa, Japan

[21] Appl. No.: 08/381,401

[22] Filed: Jan. 31, 1995

[30] Foreign Application Priority Data

Mar. 9, 1994 [JP] Japan .................................. 6-038031

[51] Int. Cl.⁶ ............................................... H01L 21/324
[52] U.S. Cl. ........................ 438/471; 438/770; 438/301
[58] Field of Search .......................... 437/10, 247, 248, 437/43, 238; 117/13, 3, 20, 17; 148/DIG. 3; 438/471, 770, 197, 301

[56] References Cited

U.S. PATENT DOCUMENTS

| | | | |
|---|---|---|---|
| 4,548,654 | 10/1985 | Tobin | 437/10 |
| 4,769,107 | 9/1988 | Helmreich et al. | 437/248 |
| 4,889,493 | 12/1989 | Otsuki et al. | 437/248 |
| 4,981,549 | 1/1991 | Yamashita et al. | 117/13 |
| 5,047,370 | 9/1991 | Yamamoto et al. | 437/248 |
| 5,215,620 | 6/1993 | Kodama et al. | 117/13 |
| 5,228,927 | 7/1993 | Kitagawara et al. | 437/13 |
| 5,359,959 | 11/1994 | Fusegawa et al. | 117/13 |
| 5,373,805 | 12/1994 | Takano et al. | 417/13 |
| 5,394,825 | 3/1995 | Schmid et al. | 117/13 |
| 5,474,019 | 12/1995 | Akashi et al. | 117/1 |
| 5,476,065 | 12/1995 | Ikezawa et al. | 117/217 |
| 5,477,806 | 12/1995 | Akashi et al. | 117/13 |
| 5,492,845 | 2/1996 | Fujimaki | 437/247 |
| 5,496,747 | 3/1996 | Hong | 437/43 |

FOREIGN PATENT DOCUMENTS

| | | | |
|---|---|---|---|
| 536958A1 | 4/1993 | European Pat. Off. | 117/13 |
| 6-48887 | 2/1994 | Japan | 117/13 |

OTHER PUBLICATIONS

The Merit of Hydrogen Annealed Si Wafer—Yoshiaki Matsushita—Semiconductor World, Jan. 1994, pp. 98–101.

Thermal Behavior of Three Type (sic) of Precipitates in As–Grown CZ Silicon Crystals—Kasuhiko Kashima et al.—Proceedings of the 45th Symposium on Semiconductors and Integrated Circuits Technology—Tokyo Dec. 1 and 2, 1993, pp. 89–93.

*Primary Examiner*—John F. Niebling
*Assistant Examiner*—S. Mulpuri
*Attorney, Agent, or Firm*—Armstrong, Westerman, Hattori, McLeland & Naughton

[57] ABSTRACT

Si melt is prepared in a crucible with a quartz surface, the crucible and a seed crystal are rotated at a relative speed of 30 rpm or more to melt quartz into Si melt, and a Si single crystal ingot is grown to have an interstitial oxygen concentration of about $1.5 \times 10^{18}$ atoms/cm$^3$ or more. A wafer is sliced from the ingot and subjected to a heat treatment in a hydrogen atmosphere at 1200° C. for one hour. Thereafter, a thermal oxide film is formed on the surface of a wafer, and a MOS transistor or capacitor is formed by using this thermal oxide film.

11 Claims, 12 Drawing Sheets

METHOD OF MANUFACTURING A SEMICONDUCTOR COMPRISING AN OXYGEN-CONTAINING SILICON WAFER

BACKGROUND OF THE INVENTION a) Field of the Invention

The present invention generally relates to a highly reliable semiconductor device and its manufacturing method, and particularly to a silicon semiconductor device having a high breakdown voltage and reliability and its manufacturing method.

In this specification, an "interstitial oxygen concentration" is a concentration defined by OLD-ASTM (ASTM 79).

b) Description of the Related Art

As semiconductor devices, particularly integrated circuit devices with MOS elements, are scaled down or becoming finer, the channel length tends to be shortened. As the channel length becomes shorter, a stronger electric field is generated in the device if the same voltage is applied, and a so-called hot carrier effect occurs. Hot carriers in a high energy state may cause leak current or deteriorate an oxide film if they pass through the film by tunneling.

A noticeable method of improving the reliability of a thermal oxide gate insulating film of a MOS transistor on a silicon substrate, is to reduce impurities in the silicon substrate and improve its crystallinity.

A flash memory is expected to become a substitute for a magnetic storage device in the near future. However, as carriers are injected into a floating gate, this tunneling current deteriorates the gate insulating film. It has been long desired to develop a high quality silicon oxide film capable of suppressing the gate insulating film from being deteriorated by a tunneling current.

The following two methods are supposed to be effective for improving the performance of a silicon substrate.

(1) Optimizing the manufacturing conditions of a silicon single crystal ingot from which silicon substrates are sliced.

(2) Improving the quality of a surface layer of a silicon substrate sliced from an ingot by processing the substrate.

Both the methods have been found contributive to the improvement of reliability of a gate insulating film.

The second method (2) will be first discussed.

With the Czochralski method, silicon is melted in a crucible made of carbon whose surface is covered with quartz. A single crystal is grown from the surface of Si melt. The grown silicon single crystal contains oxygen atoms in an oversaturated state, the oxygen atoms being melted out from quartz of the crucible. Oxygen atoms in a Si crystal have a variety of merits such as raising the crystal mechanical strength and gettering poisonous impurities.

However, the electrical property of an integrated circuit device using a silicon substrate sliced from a silicon single crystal ingot containing oxygen atoms in an oversaturated state may be degraded by oxidation-induced stacking faults (OSF) or surface micro defects (SMD) caused by precipitation of oxygen atoms in the form of $SiO_2$ (or $SiO_x$) during heat treatments of manufacturing processes.

For example, during heat treatments of manufacturing processes for an integrated circuit device, interstitial oxygen atoms contained in a silicon substrate precipitate on the area near the silicon substrate surface in the form of $SiO_2$.

Under this condition, "oxidation" for forming a gate insulating film on a silicon substrate surface becomes abnormal "oxidation" at the area with precipitations. Therefore, the crystal structure of the oxide film does not show a regular tetrahedron structure of $SiO_2$ at the area with precipitations.

It is known that the breakdown voltage at the area without a regular tetrahedron structure is degraded. The lifetime of a gate oxide film formed at the area with precipitations is shortened.

It is also known that even if interstitial oxygen atoms in a silicon substrate of an integrated circuit device locally precipitate in the form of $SiO_x$ during heat treatments of manufacturing processes, the SiO. precipitations can be changed harmless by subjecting the Si substrate to a heat treatment at about 1200° C. before the formation of a gate insulating film, because the $SiO_x$ precipitations are decomposed and oxygen atoms are captured or trapped again in the crystal lattice.

However, general manufacturing processes for an integrated circuit device have essentially various heat treatments at a temperature lower than 1200° C. following the heat treatment at 1200° C. At this later heat treatment, oxygen atoms in the silicon substrate precipitate in some cases again on the substrate surface in the form of $SiO_x$.

As a result, the 1200° C. heat treatment for decomposing local $SiO_x$ precipitations is not so effective.

The following two methods are generally supposed to be effective for reducing the amount of $SiO_x$ precipitations to be caused by a heat treatment at a temperature lower than 1200° C.

(3) Lowering an interstitial oxygen concentration near the substrate surface to a saturated concentration or lower at the lowest temperature of the integrated circuit device manufacturing processes (bulk processes for heating the silicon substrate).

(4) Suppressing generation of grown-in defects which allow interstitial oxygen atoms precipitate and generation of inhomogeneous nuclei of impurities such as carbon other than oxygen melted out of a quartz coated carbon crucible, during the process of growing a silicon single crystal by the Czochralski method.

The method (3) has been introduced from an analogous reduction of a saturated solution theory. Even if a silicon substrate contains nuclei for precipitating oxygen in the form of $SiO_x$, $SiO_x$ will not be precipitated if oxygen atoms are not in an oversaturated state.

The method (4) suppresses generation of precipitation nuclei for interstitial oxygen atoms. For example, a pulling speed of a silicon single crystal is made sufficiently low. For example, the average pulling speed is lowered from about 0.8 mm/min to about 0.4 mm/min.

Although these methods are effective for preventing precipitation of interstitial oxygen, they are disadvantageous over the Cottrell effect which getters harmful impurities such as transition metals in a silicon substrate by precipitation nuclei.

For realizing both the impurity gettering and the reduction of interstitial oxygen concentration, the intrinsic gettering (IG) method has been used conventionally.

FIGS. 9A to 9D are cross sectional views explaining the processes of gettering oxygen atoms in a silicon substrate by the IG method.

In these figures, reference numeral 21 represents a silicon substrate, reference numeral 22 represents interstitial oxygen atoms, reference numeral 23 represents oxide films, reference numeral 24 represents precipitation nuclei, and reference numeral 25 represents stacking faults.

The outline of the IG method will be explained with reference to FIGS. 9A to 9D.

Figure 9A:
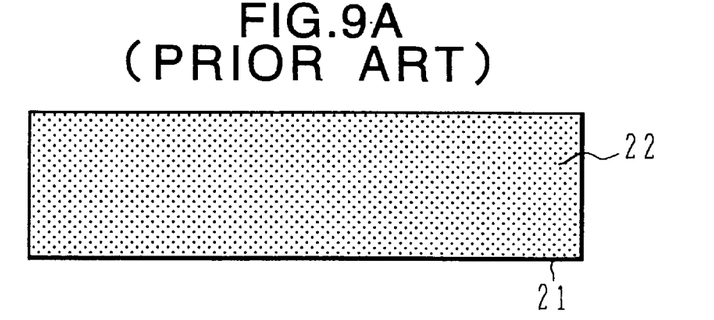
FIGS. 9A–9D are cross sectional views illustrating the processes of oxygen gettering in a silicon substrate by the conventional IG method.

First Process (refer to FIG. 9A)

A silicon single crystal is grown by the Czochralski method, and sliced to form the silicon substrate 21.

Interstitial oxygen atoms 22 (indicated by dots) are distributed in the whole area of the silicon substrate 21 at a certain concentration which depends on the rotation speed of a seed crystal for growing a crystal ingot. As the rotation speed is raised, a relative motion of Si melt to a quartz crucible becomes larger so that oxygen atoms melt more into the Si melt and eventually into a Si single crystal.

Figure 9B:
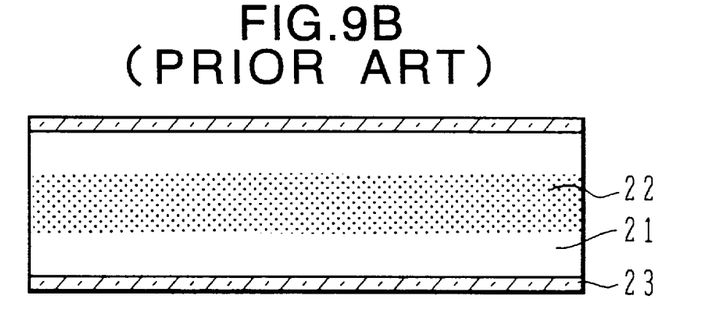

Second Process (refer to FIG. 9B)

After the thin oxide films 23 are formed on the surfaces of the silicon substrate 21 so as to suppress surface roughening and contamination by atmosphere, the silicon substrate 21 is subjected to a heat treatment at a high temperature of about 1100° C. or higher in a non-oxidizing atmosphere such as nitrogen gas to thereby diffuse interstitial oxygen ($O_i$) near the substrate surface to the outside of the substrate 21.

At the surface, the interstitial oxygen atoms in the substrate can escape outward (into the atmosphere), but there is no or almost no oxygen atoms coming into the crystal from the outside. Thus, the interstitial oxygen concentration $O_i$ near the surface of the silicon substrate 21 lowers by the outward diffusion. The interstitial oxygen concentration at the central area of the silicon substrate does not change so much because oxygen atoms diffused outward and inward are mutually cancelled.

Figure 9C:
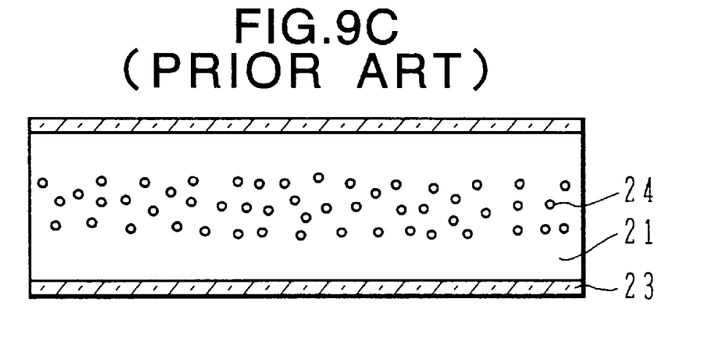

Third Process (refer to FIG. 9C)

The silicon substrate 21 is subjected to a heat treatment at a low temperature of 500° to 700° C. to form nuclei 24 such as crystal defects in the silicon substrate 21, the nuclei 24 functioning to precipitate interstitial oxygen.

Figure 9D:
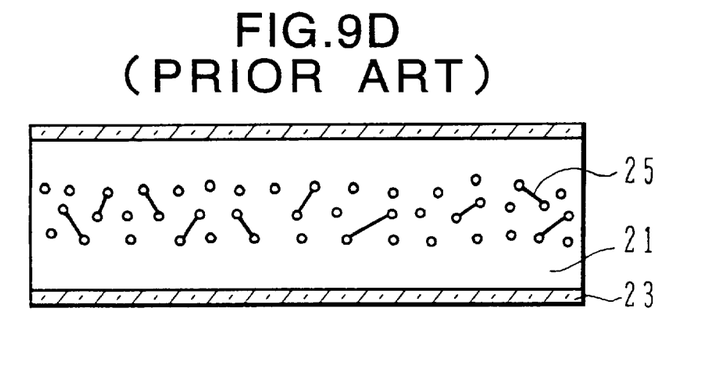

Fourth Process (refer to FIG. 9D)

As the temperature is gradually raised thereafter, the precipitation nuclei 24 in the silicon substrate 21 grow and change to the large stacking faults 25.

As the density of the large stacking faults 25 becomes high, although the mechanical strength of the silicon substrate lowers, the surface of the silicon substrate has less interstitial oxygen, thereby providing a layer capable of forming a semiconductor element having an excellent property.

The IG method appears to be able to solve all problems resulting from interstitial oxygen.

However, the IG method has a limit in the amount of interstitial oxygen atoms to be outward diffused at the second process (FIG. 9B), from the following reason.

Upon heating a bare silicon substrate in a non-oxidizing atmosphere such as nitrogen or argon gas, surface roughening occurs. In the case of the nitrogen gas, the surface roughening of a silicon substrate is generated by nitrogen. In the case of an Ar atmosphere, a practically usable Ar gas contains impurities such as nitrogen so that the surface roughening of the silicon substrate is inevitable similar to the case of a nitrogen atmosphere.

In order to prevent the surface roughening of a silicon substrate, the surface is formed with a silicon oxide film as shown in FIG. 9B. Although this silicon oxide film suppresses the surface roughening, it limits the amount of interstitial oxygen outward diffused. Interstitial oxygen atoms left in the silicon substrate precipitate on the surface thereof at later heat treatments of integrated circuit device manufacturing processes, deteriorating the device performance.

The oxygen precipitating nuclei 24 formed at the third process change to the large stacking faults 25, lowering the mechanical strength of the silicon substrate.

Annealing a silicon substrate in a hydrogen atmosphere has been proposed as a method of solving these contradictory problems (for example, Y. Matsushita, "Semiconductor World" 1994 January issue, pp.98–101).

As a silicon substrate is annealed in an hydrogen atmosphere, a native oxide film on the surface of the silicon substrate is first sublimated and the silicon substrate becomes bare.

There is therefore no film which suppresses interstitial oxygen from being outward diffused, and the interstitial oxygen concentration reduces efficiently near the substrate surface. Outward diffusion of interstitial oxygen atoms appears to be promoted by hydrogen. An oxygen concentration lower than that obtained by the conventional technique of outwardly diffusing interstitial oxygen can be realized.

From another viewpoint, hydrogen can be considered to be contributive to decomposition or removal of oxygen precipitation nuclei because hydrogen has a strong reduction ability.

All problems appear to be solved by annealing a silicon substrate in a hydrogen atmosphere. Silicon substrates processed by this method are therefore sold in markets.

It has been reported that if a Si crystal ingot pulled up by the Czochralski method is maintained at a temperature of 1300° C. or higher for 60 minutes or longer, a gradual cooling effect is obtained by which interstitial oxygen atoms meet lattice vacancies and disappear (become substitutional oxygen atoms).

SUMMARY OF THE INVENTION

It is an object of the present invention to provide a method of manufacturing a semiconductor device capable of manufacturing a Si wafer having a higher quality than that of a Si wafer annealed in a hydrogen atmosphere by the conventional technique.

It is another object of the present invention to provide a semiconductor device with a thermal oxide film having a high breakdown voltage and reliability.

According to one aspect of the present invention, there is provided a method of manufacturing a semiconductor device, including the steps of: growing a silicon single crystal ingot under such growth conditions that allow the ingot to contain electrically inactive interstitial impurities at a concentration of about $1.5 \times 10^{18}$ atoms/cm$^3$ or more; slicing a wafer from the ingot; heating the wafer in a reducing atmosphere; and forming a thermal oxide film on the surface of the wafer.

According to another aspect of the present invention, there is provided a method of manufacturing a semiconductor device, including the steps of: preparing Si melt in a crucible with a quartz surface and growing a silicon single crystal ingot by controlling a pulling speed and a temperature distribution so as to allow every point in the ingot to reach a temperature lower than 1300° C. within 60 minutes; slicing a wafer from the ingot; heating the wafer in a reducing atmosphere; and forming a thermal oxide film on the surface of the wafer.

According to still another aspect of the present invention, there is provided a semiconductor device including: a Si substrate including a central layer having an interstitial oxygen concentration of about $1.5 \times 10^{18}$ atoms/cm$^3$ or higher and a surface layer having an interstitial oxygen concentration significantly lower than that of the central layer; a thermal oxide film formed on the surface of the Si substrate and having a thickness of about 10 nm or less; and a conductive electrode formed on the thermal oxide film.

The inventor has found that the charge to dielectric breakdown of a thermal oxide film formed on a Si substrate annealed in H$_2$ depends on an interstitial oxygen concentration. If an interstitial oxygen concentration of an Si crystal before annealing, i.e., a Si crystal as grown, is lower than $1.5 \times 10^{18}$ atoms/cm$^3$, the charge to dielectric breakdown often lowers by annealing in H$_2$.

This may supposedly result from that although the Si crystal surface annealed in hydrogen is a good crystal having a low interstitial oxygen concentration, the bare surface exposes dangling bonds which are likely to form bonds with other atoms and incorporate external impurity sources. It is considered that external impurities incorporated in the crystal are not sufficiently gettered if the interstitial oxygen concentration is low.

The reliability of an oxide film can be improved by employing a Si wafer having an interstitial oxygen concentration of $1.5 \times 10^{18}$ atoms/cm$^3$ or higher and thermally oxidizing a silicon substrate after annealing the substrate in hydrogen. The reliability of a high integration density integrated circuit device constituted by MOSFET elements can be improved, and the lifetime of a flash memory can be prolonged.

DETAILED DESCRIPTION OF THE PREFERRED EMBODIMENTS

The inventor grew Si crystals by the Czochralski method under various conditions. Sliced wafers were annealed in a hydrogen atmosphere. Thermal oxide films and MOS capacitors were formed on wafers to study the characteristics of MOS capacitors. The property of each capacitor dielectric film can be known from the characteristics of the MOS capacitor.

Figure 1:
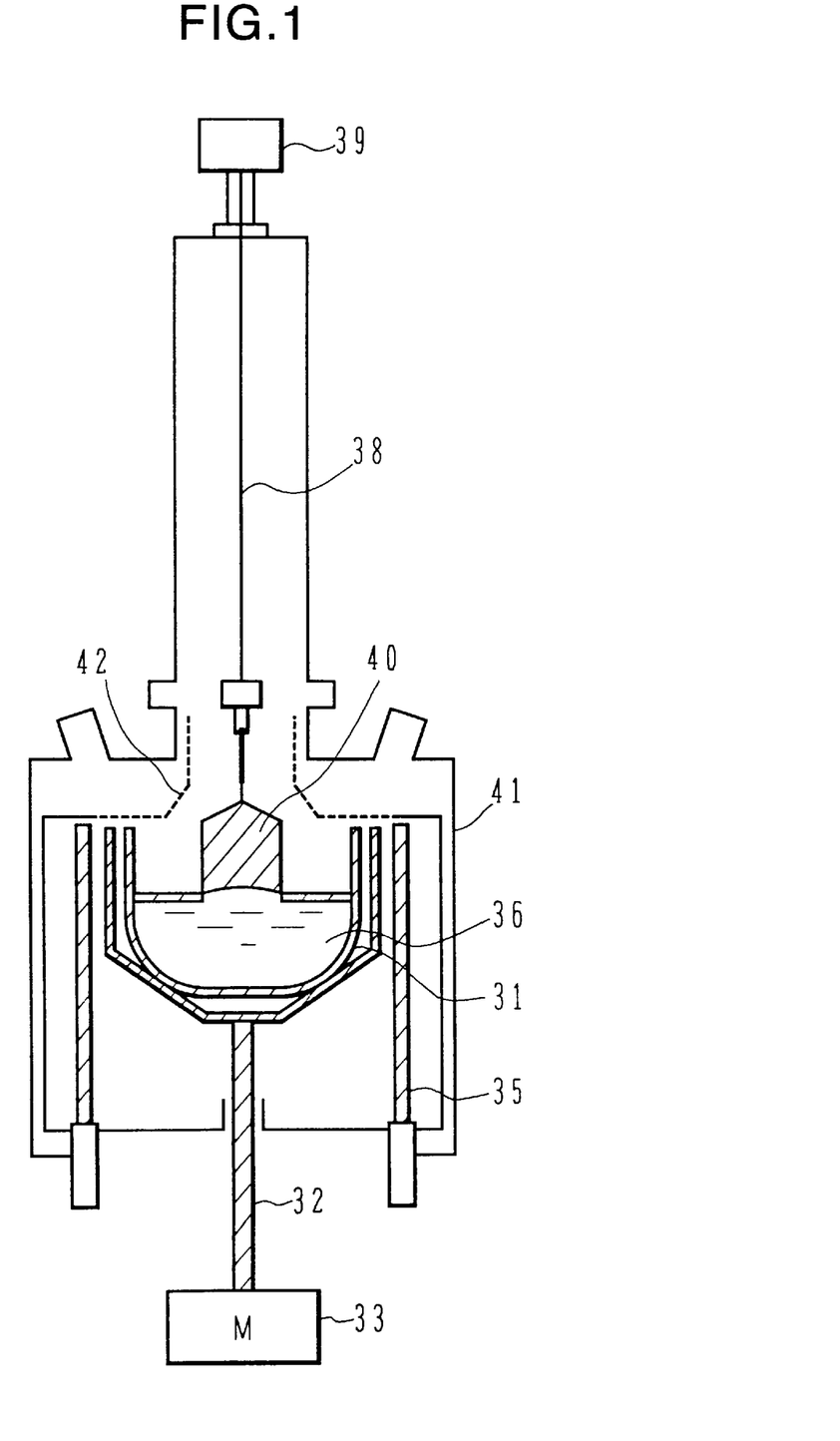
FIG. 1 is a schematic cross sectional view of a Czochralski type crystal growth system.

FIG. 1 is a schematic cross sectional view showing the structure of a Czochralski type single crystal growth system. A quartz crucible 31 made of carbon container coated with quartz is supported by a shaft 32 and rotated by a motor 33 coupled to the shaft 32. The crucible 31 is surrounded by a carbon heater 35, and heated to a desired temperature. Si melt 36 is contained in the crucible 31.

A wire roll-up mechanism 39 is disposed above the crucible 31 to rotate and lift a pull wire 38. A seed crystal is attached to the lower end of the wire 38. The seed crystal is contacted with the Si melt to form a solid-liquid interface and then is pulled up to grow a Si ingot 40. The surface of the Si melt 36 is maintained at a temperature of about 1421° C. slightly higher than the Si melting point. While the seed crystal is rotated and pulled up, the Si ingot 40 grows on the seed crystal. The growth speed, ingot diameter, impurity level, and other parameters can be regulated by controlling the temperature distribution, pulling speed, and other factors. In order to protect the carbon heater and prevent the grown Si ingot 40 from being oxidized, the whole growth system is installed in a housing 41 capable of being evacuated. Usually, Ar gas is supplied in the housing 41 to form an inert atmosphere. The crystal ingot is grown in an inert gas atmosphere such as Ar, or in a vacuum atmosphere. A heat shield 42 is disposed near the crystal growth region in order to define a hot zone and maintain the crystal near the growth surface at a high temperature.

The heat shield 42 is arranged to be detachable and a system capable of blowing Ar gas to the grown Si ingot is provided for cooling the grown crystal.

The quartz crucible 31 is in contact with the Si melt 36 so that quartz of the crucible melts into the Si melt 36. Even if Si in quartz (SiO$_2$) melts into the Si melt, there is no problem because Si is the same element as the Si melt 36. If O (oxygen) in quartz melts into the Si melt 36, it is incorporated into the grown crystal 40. The concentration of oxygen incorporated in the grown crystal 40 depends on the oxygen concentration in the Si melt 36. If the Si melt 36 flows relative to the surface of the quartz crucible 31, fresh Si melt is supplied to the quartz surface, and more oxygen melts into the Si melt 36. As a result, if the relative flow of the Si melt 36 to the crucible 31 is controlled, the oxygen concentration in the Si melt and hence that in the grown Si crystal 40 can be regulated. The simplest method of controlling the relative flow is to regulate the rotation speeds of the crucible 31 and the wire 38. Other methods may be used so long as they can regulate the relative flow of the Si melt or control the oxygen concentration.

The crystallinity of pulled crystals depends on the pulling speed i.e. growth speed. A low growth speed CZ crystal is known to provide a high initial breakdown voltage of an oxide film. When the pulling speed is made high, crystal defects tends to increase. Since these crystal defects form oxygen precipitation nuclei, the density of precipitation nuclei changes also. The pulling speed itself is being lowered during growth, and is arranged to be finally higher than 0.8 mm/min. In the following examples, the pulling speed was gradually lowered during growth and the final pulling speed was set to about 1.1 mm/min. This pulling speed is higher than conventional ones.

The temperature of the Si crystal 40 grown from the Si melt gradually lowers while the Si crystal 40 is pulled up. Interstitial oxygen atoms and lattice vacancies in Si generated during the crystal growth migrate in the crystal at a high temperature. It is known that these crystal defects are reduced by the gradual cooling effect if the crystal is maintained at 1300° C. or higher for 60 minutes or longer. The higher the cooling speed is, the precipitation nuclei density increases more. For increasing the cooling speed, gas blow system is provided in the housing to blow Ar gas to the grown crystal in the absence of the heat shield 42. The cooling speed of the grown crystal can be controlled by controlling the Ar gas supply.

From the viewpoint of improving the reliability of a thermal oxide film formed on a Si wafer, the inventor studied emphatically the accumulative amount of charge to dielectric breakdown which adversely affects the reliability.

Figure 2A:
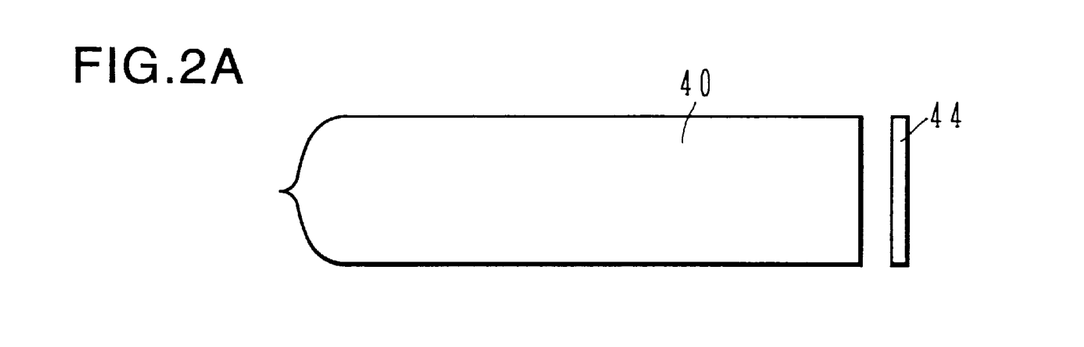
FIGS. 2A–2D are schematic diagrams illustrating the processes of manufacturing a semiconductor device using a wafer sliced from a Si ingot.
Figure 2B:
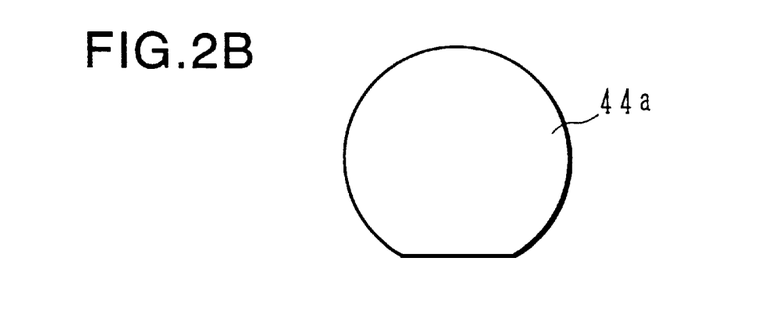

As shown in FIG. 2A, Si wafer 44 are sliced from a Si ingot 40 grown under preselected conditions. The ingot 40 has a diameter of six inches or more. The Si wafer is worked to polish the main surface and form an orientation flat, and a silicon wafer 44*a* such as shown in FIG. 2B is obtained.

Figure 2C:
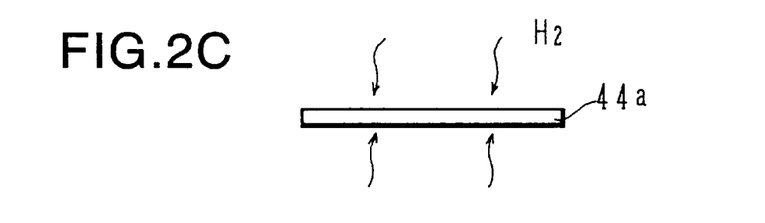

As shown in FIG. 2C, the Si wafer 44*a* is annealed in a hydrogen atmosphere at 1200° C. for 60 minutes.

Figure 2D:
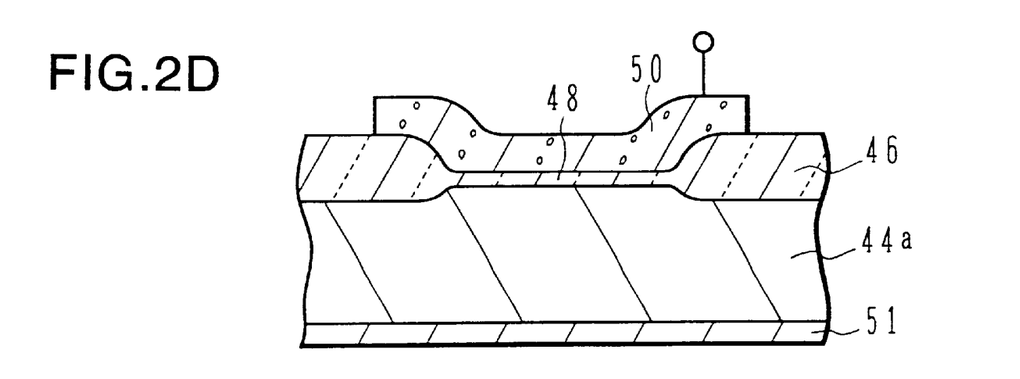

As shown in FIG. 2D, the top surface of the Si substrate 44*a* is formed with a thick field oxide film 46 by local oxidation of silicon and a thin oxide film 48 by thermal oxidation at a high temperature, on which a polycrystalline silicon electrode 50 is formed. The bottom surface of the Si substrate 44*a* is formed with another electrode 51. The characteristics of the thermal oxide film 48, which is a dielectric film of a MOS capacitor, were checked.

Figure 3A:
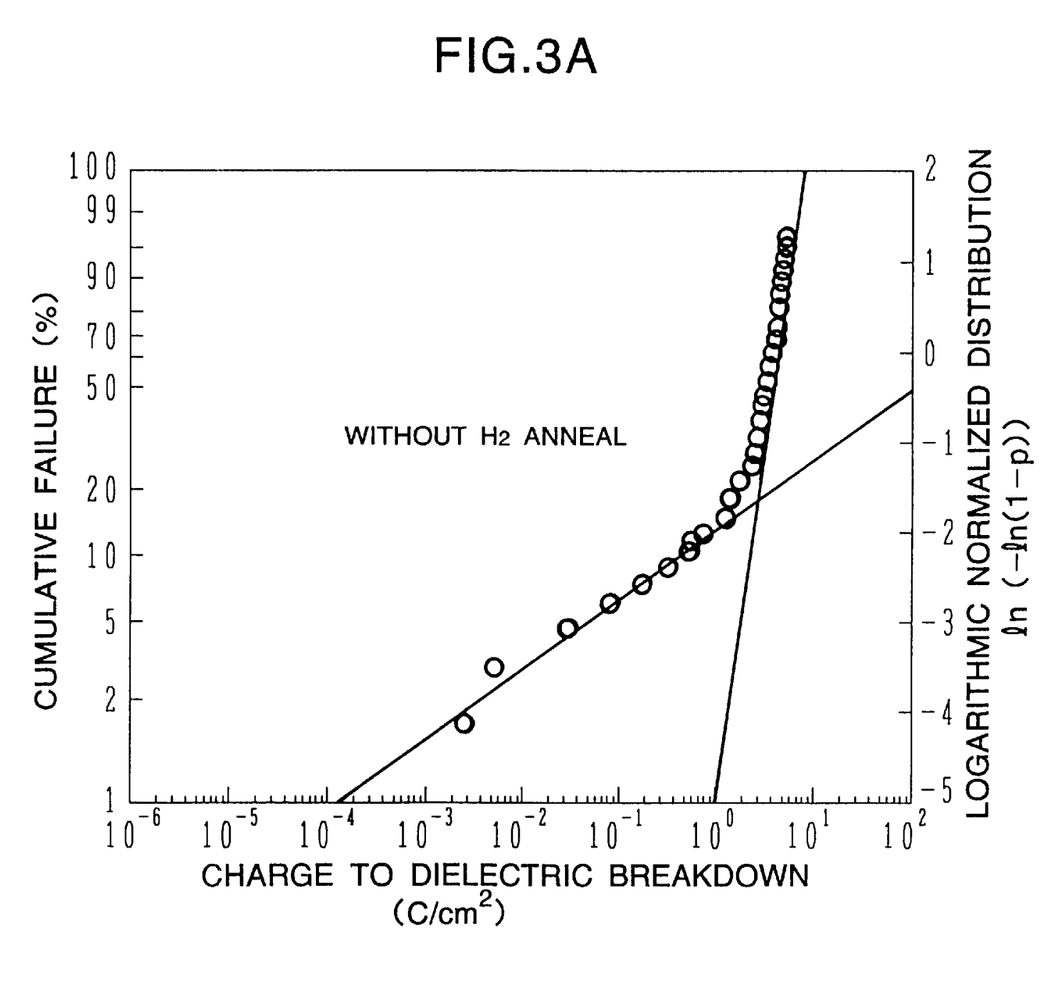
FIG. 3A and 3B are graphs showing the characteristics of conventional MOS capacitors, without H$_2$ annealing in FIG. 3A and with H$_2$ annealing in FIG. 3B.
Figure 3B:
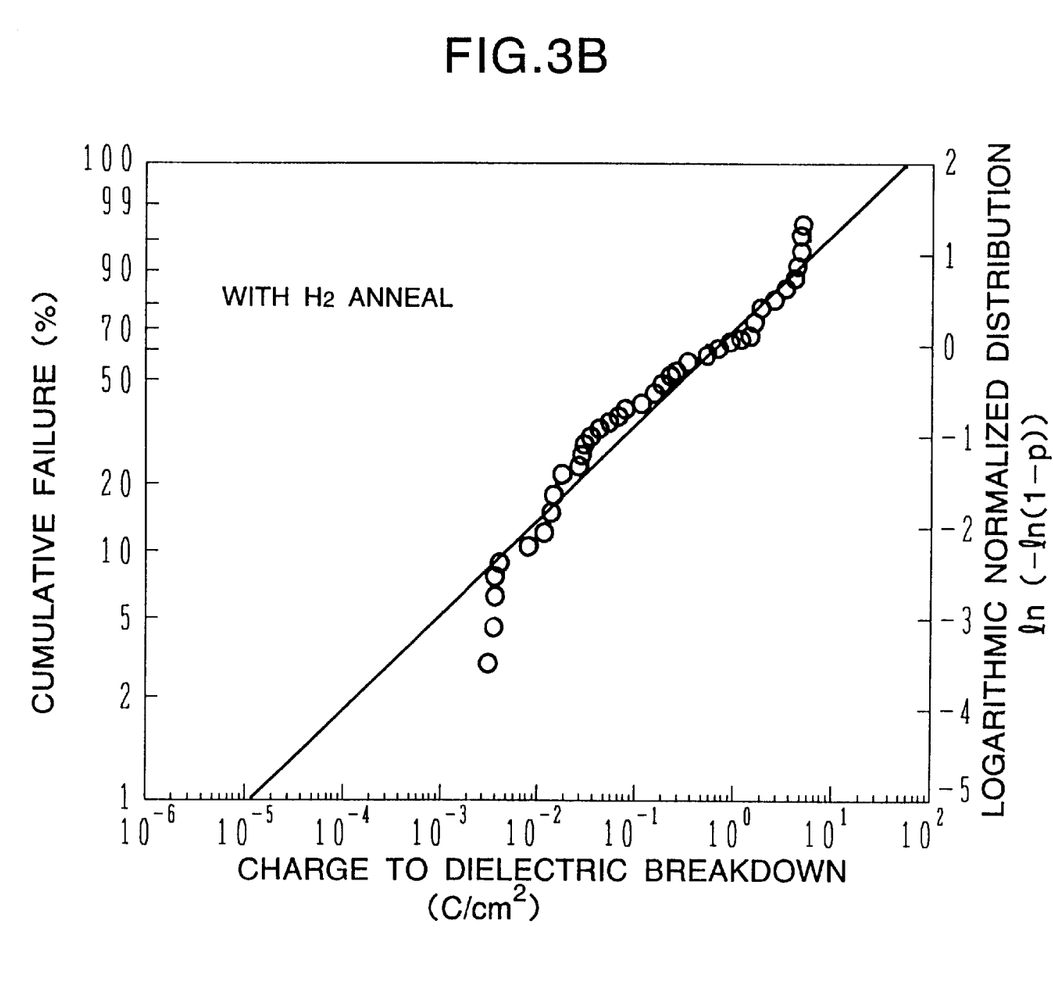

FIGS. 3A and 3B are graphs showing the characteristics of conventional MOS capacitors formed on conventional Si wafers. FIG. 3A shows the case without $H_2$ annealing and FIG. 3B shows the case with $H_2$ annealing.

In FIGS. 3A and 3B, the abscissa represents a dielectric breakdown charge indicating a charge having flown through an insulating film (thermal oxide film) until a dielectric breakdown occurs, and the ordinate represents a cumulative failure indicating a logarithmic normalized distribution (Weible plots). The curve rises once at the region having a low dielectric breakdown charge (initial breakdown), then gradually rises on a gentle slope (accidental breakdown), and finally abruptly rises at the region in excess of a certain dielectric breakdown charge (intrinsic breakdown). The better the characteristics of MOS capacitors are, the larger is the amount of carriers (electric charge) having passed through the oxide film until the intrinsic breakdown occurs, i.e., at the higher dielectric breakdown charge the abruptly rising curve is located, or at the lower cumulative failure the intrinsic breakdown starts.

Sample wafers were obtained from a silicon single crystal grown by the Czochralski (CZ) method and gradually cooled by the conventional hot zone treatment at 1300° C. or higher for about 80 minutes. Silicon substrates without $H_2$ annealing have the characteristics of FIG. 3A. When they are subjected to $H_2$ annealing, the characteristics become as shown in FIG. 3B. As is shown, characteristics are not improved, but rather deteriorated by $H_2$ annealing. It has been found that $H_2$ annealing of a general CZ crystal may deteriorate the characteristics. This is considered to be ascribed to a time-dependent influence of migration of impurity atoms, because the initial dielectric breakdown of a thermal oxide film on an $H_2$ annealed wafer is high.

Figure 4:
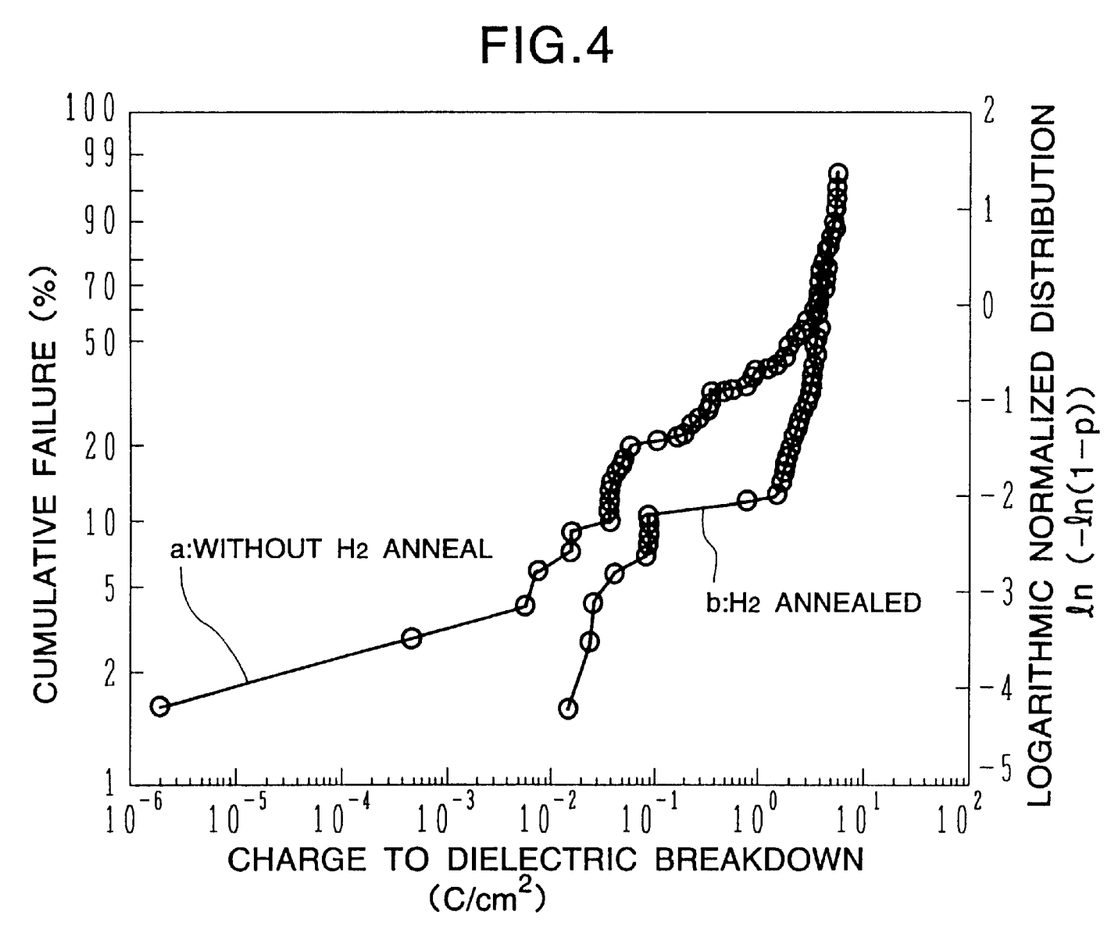
FIG. 4 is a graph showing the characteristics of MOS capacitors according to an embodiment of the invention.

FIG. 4 is a graph showing the characteristics of MOS capacitors. The samples include those MOS capacitors which are formed by using a silicon substrate sliced from a silicon single crystal grown by the Czochralski method at the final pulling speed of about 1.1 mm/min and rapidly cooled to 1300° C. in about 30 minutes, and those MOS capacitors which are formed by using such a silicon substrate made as described above and further annealed in a pure hydrogen atmosphere. The rapid cooling is considered, as discussed earlier, to raise the precipitation nuclei density.

In the graph, the abscissa represents a dielectric breakdown charge, and the ordinate represents a cumulative failure indicating a logarithmic normalized distribution. The better are the characteristics of MOS capacitors, the larger is the amount of carriers (electric charge) having passed through the oxide film until the breakdown occurs, i.e., at the higher dielectric breakdown charge the abruptly rising curve is located.

As seen from this graph of FIG. 4, MOS capacitors with $H_2$ annealing (curve b) of a silicon substrate sliced from a silicon single crystal grown by the Czochralski method at the final pulling speed of about 1.1 mm/min and rapidly cooled, i.e. only being kept at 1300° C. or higher for about 30 minutes, have the characteristics considerably improved as compared to the characteristics of MOS capacitors without $H_2$ annealing (curve a). The initial breakdown occurs at higher breakdown charge, the accidental breakdown is reduced, and the intrinsic breakdown occurs at higher breakdown charge. It is considered that the crystal is not still recovered because of the rapid cooling and a number of precipitation nuclei distribute in the crystal. When $H_2$ annealing is performed under the above a conditions, interstitial oxygen atoms are considered to have reduced greatly in the surface layer and impurities from the surface are trapped by the precipitation nuclei at deep locations.

Silicon single crystals were grown by the Czochralski method to have various interstitial oxygen concentrations by changing the relative rotation speed of seed crystals to a crucible, at the final pulling speed of about 1.1 mm/min, and were rapidly cooled to 1300° C. in about 30 minutes. Silicon wafers were sliced from the grown ingots and annealed in an $H_2$ atmosphere at 1200° C. for one hour, and then MOS capacitors were formed on the silicon substrates.

Figure 5:
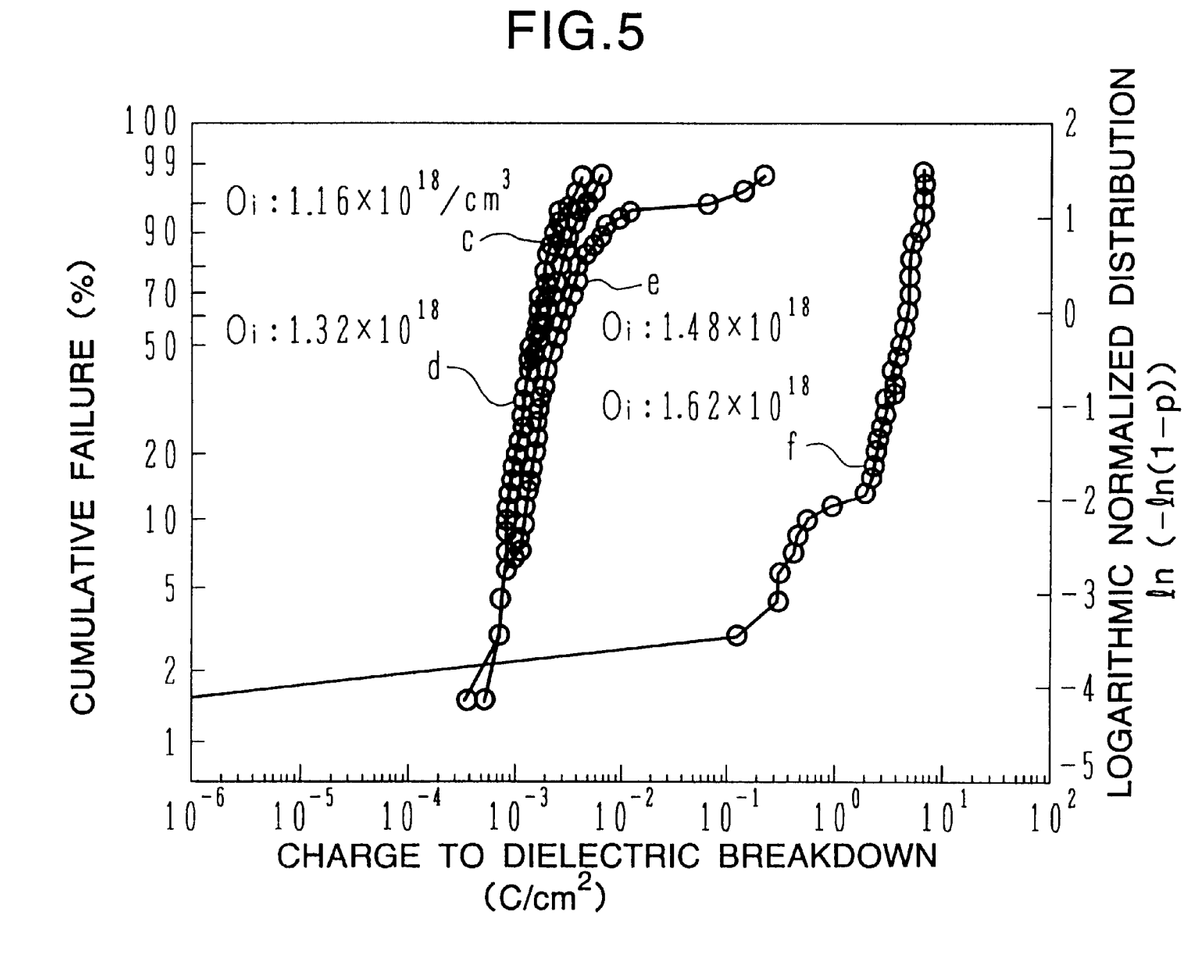
FIG. 5 is a graph showing the characteristics of MOS capacitors according to another embodiment of the invention.

FIG. 5 is a graph showing the characteristics of MOS capacitors formed on Si substrates having various interstitial oxygen concentrations. As capacitor dielectric films, thermal oxide films having a thickness of 10 nm were used. Also in this graph, the abscissa represents a dielectric breakdown charge, and the ordinate represents a cumulative failure indicating a logarithmic normalized distribution. The better are the characteristics of MOS capacitors, the larger is the amount of carriers (electric charge) having passed through the oxide film until the breakdown occurs, i.e., at the higher dielectric breakdown charge the abruptly rising curve is located.

A curve (c) shows the characteristics of MOS capacitors formed on Si substrates containing interstitial oxygen atoms of about $1.16 \times 10^{18}$ atoms/cm$^3$. A curve (d) shows the characteristics of MOS capacitors formed on Si substrates containing interstitial oxygen atoms of about $1.32 \times 10^{18}$ atoms/cm$^3$. A curve (e) shows the characteristics of MOS capacitors formed on Si substrates containing interstitial oxygen atoms of about $1.48 \times 10^{18}$ atoms/cm$^3$. A curve (f) shows the characteristics of MOS capacitors formed on Si substrates containing interstitial oxygen atoms of about $1.62 \times 10^{18}$ atoms/cm$^3$.

As the interstitial oxygen concentration increases from about $1.48 \times 10^{18}$ atoms/cm$^3$ to about $1.62 \times 10^{18}$ atoms/cm$^3$, the characteristics are improved abruptly. It can be understood that the interstitial oxygen concentration is preferably about $1.5 \times 10^{18}$ atoms/cm$^3$ or higher, and more preferably about $1.6 \times 10^{18}$ atoms/cm$^3$ or higher. Conventionally, the interstitial oxygen concentration has been controlled to be smaller than $1.5 \times 10^{18}$ atoms/cm$^3$. The dielectric breakdown charge is considered to be improved by the rapid crystal growth and cooling speeds and an increased interstitial oxygen concentration.

Figure 6A:
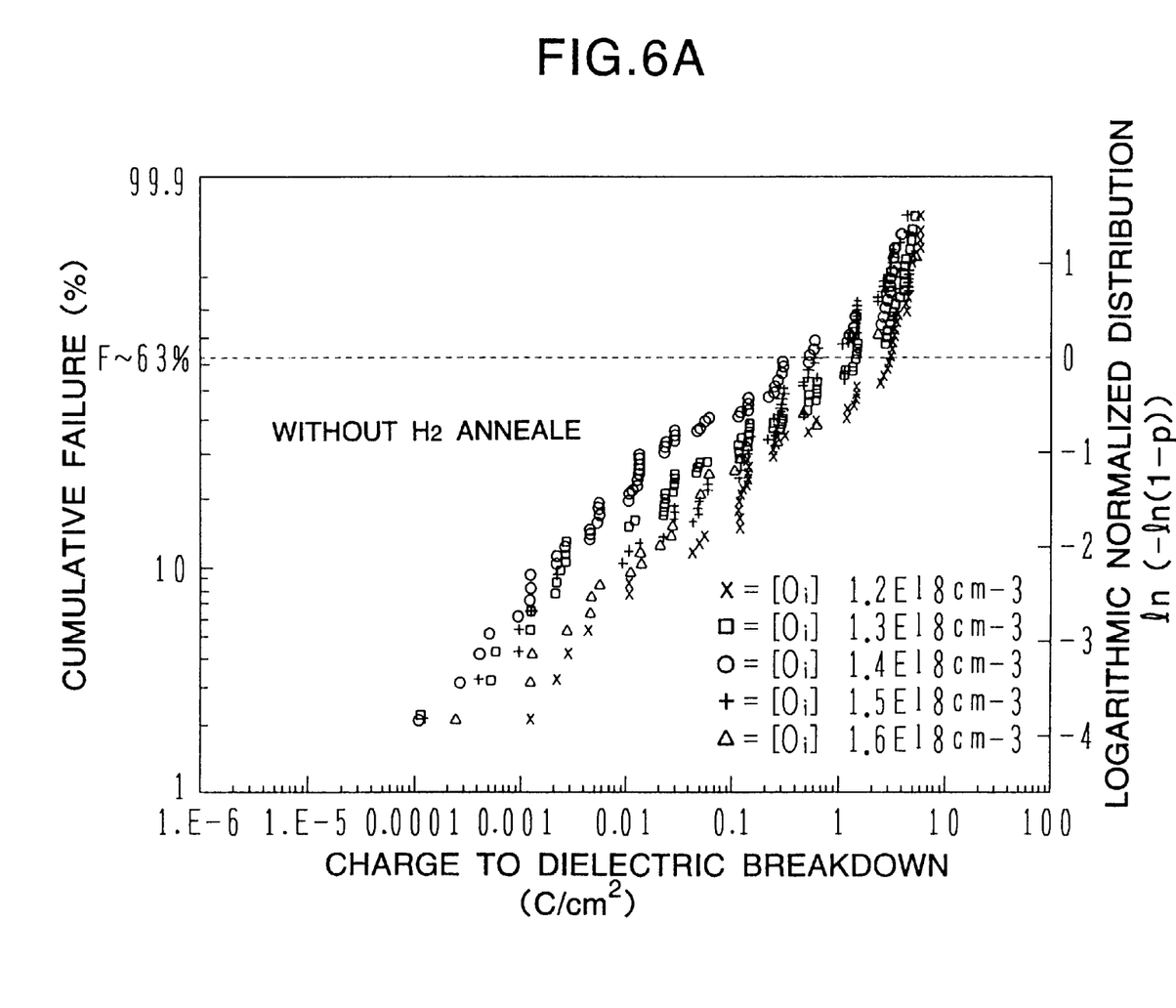
FIGS. 6A and 6B are graphs showing the characteristics of MOS capacitors according to another embodiment of the invention.
Figure 6B:
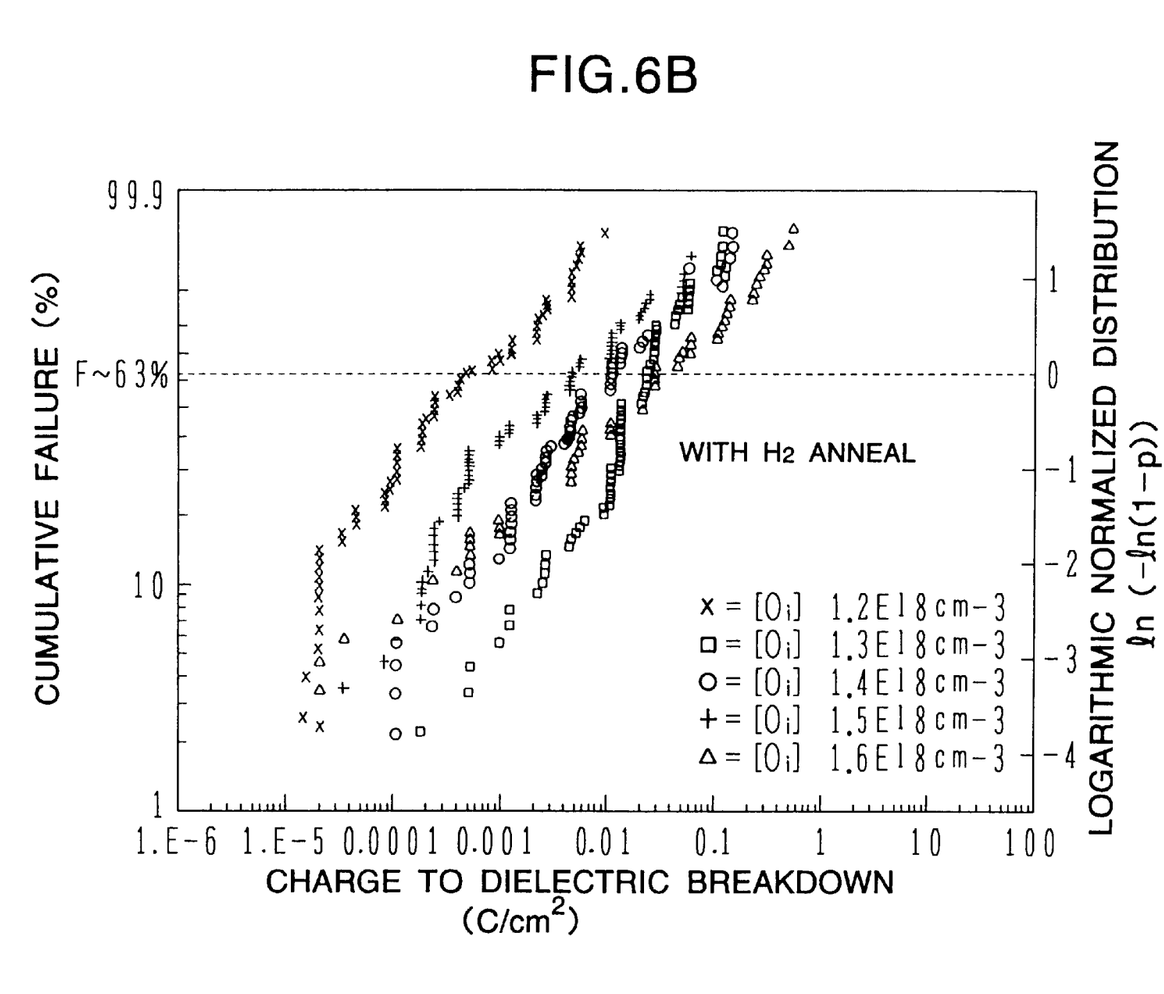

FIGS. 6A and 6B are graphs showing a cumulative failure relative to a dielectric breakdown charge of MOS capacitors, with the thickness of a thermal oxide film being set to 6 nm. FIG. 6A is a graph without H$_2$ annealing, and FIG. 6B is a graph with H$_2$ annealing. Samples used have interstitial oxygen concentrations of $1.2 \times 10^{18}$ atoms/cm$^3$, $1.3 \times 10^{18}$ atoms/cm$^3$, $1.4 \times 10^{18}$ atoms/cm$^3$, $1.5 \times 10^{18}$ atoms/cm$^3$, and $1.6 \times 10^{18}$ atoms/cm$^3$. With the thermal oxide film thickness of 6 nm, the dielectric breakdown charge at these interstitial oxygen concentrations is more deteriorated with H$_2$ annealing than without H$_2$ annealing. Although not shown in the figures, it was confirmed that good results were obtained by H$_2$ annealing at the interstitial oxygen concentration of $1.65 \times 10^{18}$ atoms/cm$^3$. It can be understood that it is preferable to increase the interstitial oxygen concentration as the thermal oxide film becomes thin. It is preferable to select an interstitial oxygen concentration of $1.6 \times 10^{18}$ atoms/cm$^3$ or more when the oxide film has a thickness of 8 nm or less, and an interstitial oxygen concentration of about $1.65 \times 10^{18}$ atoms/cm$^3$ or more when the oxide film has a thickness of 6 nm or less.

As seen from FIGS. 5, 6A, and 6B, the interstitial oxygen concentration is at least $1.5 \times 10^{18}$ atoms/cm$^3$, and preferably $1.6 \times 10^{18}$ atoms/cm$^3$ or higher, and more preferably $1.65 \times 10^{18}$ atoms/cm$^3$ or higher. This is contrary to the conventional concept. Conventionally, the interstitial oxygen concentration has been controlled to be lower than $1.5 \times 10^{18}$ atoms/cm$^3$ in order to grow a good crystal, and the growth speed has been lowered to reduce precipitation nuclei.

It is considered, however, that the interstitial oxygen concentration is preferably kept below or equal to about $1.8 \times 10^{18}$ atoms/cm$^3$.

Although interstitial oxygen atoms and precipitation nuclei in a semiconductor element forming region deteriorate the performance of the semiconductor element, they increase the mechanical strength of the semiconductor substrate and getter impurities. Because H$_2$ annealing sufficiently improves the crystallinity of a surface layer, it is desired to have sufficient interstitial oxygen atoms and precipitation nuclei in a central region of the substrate in order to provide an impurity gettering function and a substrate mechanical strength. By H$_2$ annealing, the total oxygen concentration is reduced about one order or more (1/10 or less) in the surface region compared to a central region. The oxygen concentration can be measured by static secondary ion mass spectroscopy (SIMS). Substitutional oxygen atoms are considered to be less migrated than interstitial oxygen atoms. Thus, the interstitial oxygen concentration is expected to be reduced more than one order in a surface region compared to a central region.

In order to grow a good crystal by the Czochralski method, such expedients have been employed conventionally as lowering a quartz crucible rotation speed, lowering a lift speed, lowering a cooling speed after growth, and combinations thereof. Although crystals grown by these methods have a low interstitial oxygen concentration, the inhomogeneous precipitation nuclei density is low. Oxygen atoms are not effectively precipitated in such crystals, and the gettering effect for intruded contaminations is considered to be not sufficient.

If an interstitial oxygen amount or an inhomogeneous nuclei density in a silicon substrate is increased, precipitation nuclei in the silicon substrate can getter intruded contaminations. Also in this case, H$_2$ annealing reduces the interstitial oxygen concentration near the silicon substrate surface. Similarly, contaminations intruded in the grown crystal are reduced at the surface layer.

It is expected that precipitation nuclei are not limited to oxygen and that the atmosphere during annealing is not limited to hydrogen.

If the concentration of intrinsic impurities such as oxygen excepting extrinsic impurities which include those impurities intruded from an external atmosphere, in a silicon substrate before annealing, is set to $1.5 \times 10^{18}$ atoms/cm$^3$ or more and thereafter the silicon substrate is annealed in a highly reducing atmosphere, then it becomes possible to greatly reduce the interstitial oxygen concentration at the substrate surface while maintaining a sufficient amount of interstitial oxygen atoms and precipitation nuclei in the central region of the silicon substrate. With the sufficient amount of interstitial oxygen atoms and precipitation nuclei in the central region of the silicon substrate, even if contaminations intrude, they can be gettered by the precipitation nuclei in the silicon substrate. The highly reducing atmosphere is preferably hydrogen, and the intrinsic impurities excepting extrinsic impurities are preferably oxygen coming from the quartz crucible.

It is preferable to maintain the crystal pulling speed to be 0.8 mm/min or higher even at the last stage of pulling. A sufficient inhomogeneous precipitation nuclei density can be ensured by using such a crystal pulling speed and avoiding gradual cooling of the grown crystal.

From another viewpoint, it is preferable to limit the time of maintaining a silicon single crystal after the growth at a temperature of 1300° C. or higher to a period not more than 60 minutes. If a crystal is maintained at a temperature of 1300° C. or higher for more than 60 minutes, the slow cooling effect occurs and the precipitation nuclei density in a silicon substrate lowers. By limiting the time period of maintaining a silicon substrate at a temperature of 1300° C. or higher, not more than 60 minutes, the silicon substrate is rapidly cooled and a high precipitation nuclei density can be maintained. If such a substrate is annealed in an H$_2$ atmosphere, the interstitial oxygen concentration lowers at the substrate surface and a good substrate can be obtained. The temperature of H$_2$ annealing is not limited to 1200° C. For example, H$_2$ annealing can be done at about 100° C. Annealing time will be adjusted in such cases.

The processes of manufacturing a MOSFET on a Si substrate will be described, the Si substrate having an interstitial oxygen concentration higher than a preselected level, e.g. $1.5 \times 10^{18}$ atoms/cm$^3$ and having been subjected to H$_2$ annealing as described above.

Figure 7:
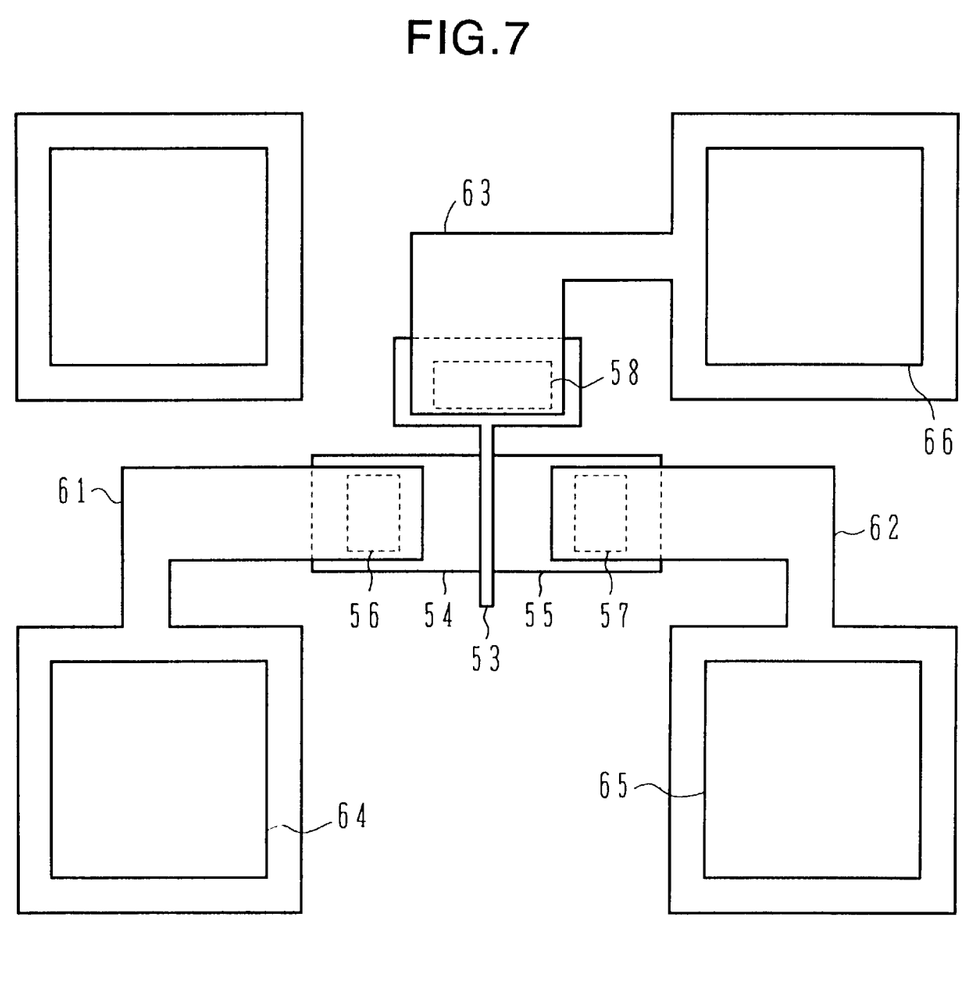
FIG. 7 is a plan view of a MOSFET according to an embodiment of the invention.

FIG. 7 is a schematic diagram showing a layout of a MOSFET.

A gate electrode 53 of polycrystalline silicon or polycide structure is formed on the surface of a Si substrate, with a gate oxide film being interposed therebetween. Source/drain regions 54 and 55 are formed on both sides of the gate electrode 53. An SiO$_2$ film as an interlayer insulating film is formed by CVD, covering the source/drain regions. Contact windows 56 and 57 are formed through the interlayer insulating film by photolithography. The interlayer insulating film also covers the gate electrode 53, and a contact window 58 is formed in the gate electrode contact region. An electrode layer, such as of Al, is formed over the contact windows 56, 57, and 58 to form source/drain electrodes 61 and 62 and a gate lead-out electrode 63 by photolithography. An interlayer insulating film is formed on these electrode layers, and contact windows are formed in the interlayer insulating film to expose contact regions 64, 65, and 66.

Such MOSFET as described above is formed on a silicon substrate prepared to have sufficient interstitial oxygen concentration.

For the growth of a silicon single crystal, the rotation speed of a seed crystal is set to about 30 rpm, the crucible rotation speed is set to about 5 rpm having a rotation direction opposite to that of the seed crystal (resulting in relative rotation speed of 35 rpm), and the pulling speed is set to have the final speed of, for example, 1.1 mm/min. Under these conditions, a single crystal is grown by the Czochralski method to have an interstitial oxygen concentration of higher than about $1.5 \times 10^{18}$ atoms/cm$^3$. The interstitial oxygen concentration is defined in conformity with OLD-ASTM.

The relative rotation speed of the seed crystal to the crucible dominates the interstitial oxygen concentration and is set preferably at about 30 rpm or more.

The silicon single crystal is sliced to form Si wafers. The Si wafers are annealed at 1200° C. for about one hour in a pure hydrogen atmosphere not containing a dilution gas such as nitrogen. A Si wafer is of a p-type and has a resistivity of 10 Ωm.

Figure 8A:
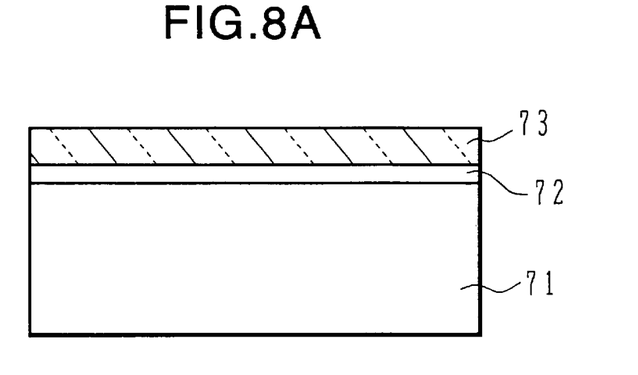
FIGS. 8A–8F are cross sectional views illustrating the method of manufacturing MOSFETs shown in FIG. 7.

As shown in FIG. 8A, on the surface of a Si wafer 71 formed as above, a silicon oxide film 72 is formed to a thickness of about 10 nm in a dry oxygen atmosphere at a temperature of 900° C. On the silicon oxide film 72, a silicon nitride film 73 is formed by CVD to a thickness of about 150 nm.

Figure 8B:
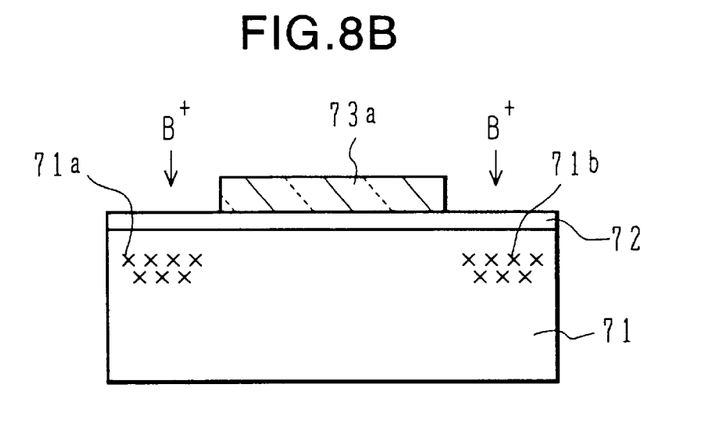

As shown in FIG. 8B, a resist film is coated on the silicon nitride film 73, exposed and developed to form an etching mask. By using this etching mask, the silicon nitride film 73 is selectively etched to form a silicon nitride mask 73a. By using the silicon nitride film mask 73a as an ion implantation mask, boron (B) ions having the same conductivity type as the substrate are implanted in the element isolation region at an acceleration voltage of 30 kV and a dose of about $5 \times 10^3$ cm$^{-2}$ to form channel stop regions 71a and 71b.

Figure 8C:
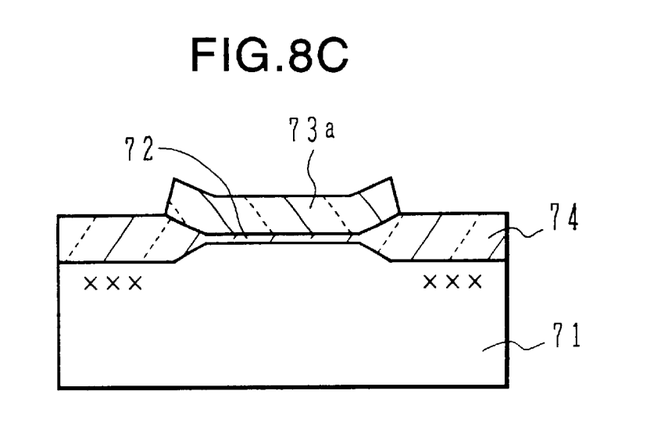

As shown in FIG. 8C, the surface of the silicon substrate 71 with the silicon nitride film mask 73a is heated in an oxidizing atmosphere containing water vapor to 900° C., and a field oxide film 74 is formed on the substrate surface not covered with the silicon nitride film mask 73a to a thickness of about 500 nm. Thereafter, the silicon nitride film mask 73a is removed by hot phosphoric acid process.

Figure 8D:
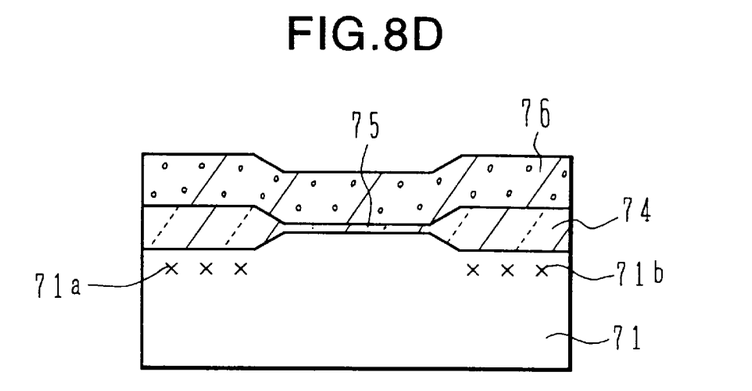

As shown in FIG. 8D, the oxide film 72 on the element forming region is removed by HF aqueous solution. Thereafter, a new silicon oxide (gate oxide) film 75 is formed to a thickness of about 9 nm by heating the substrate to 1000° C. in a dry oxygen atmosphere.

The H$_2$ annealing may be done after LOCOS process and before formation of gate oxide film, instead of before LOCOS process.

On the silicon oxide film 75, a silicon film 76 of polycrystalline silicon or amorphous silicon is deposited by chemical vapor deposition (CVD) to a thickness of about 200 nm. Phosphor (P) ions are implanted into the silicon film 76 at an acceleration voltage of 20 kV and a dose of about $8 \times 10^{15}$ cm$^2$.

On the silicon film 76 having a low resistance by P ion implantation, a silicon oxide film 77 is deposited by CVD to a thickness of about 50 nm in order to prevent phosphor (P) ions from escaping at later heat treatments. A silicide film such as tungsten silicide may be formed on the silicon film 76 to form a polycide electrode.

Figure 8E:
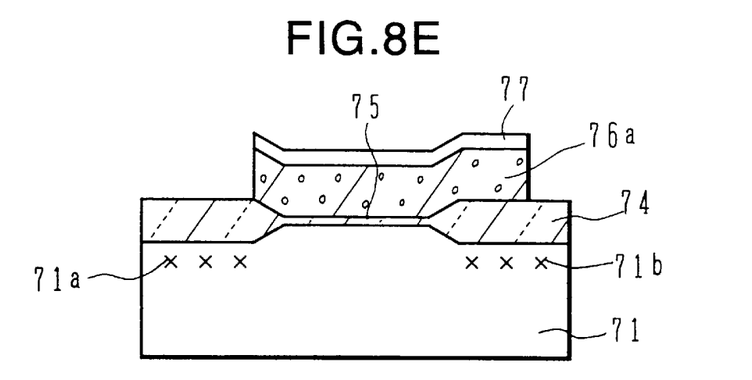

A photoresist mask is formed over the substrate surface to etch the silicon oxide film 77 and silicon film 76 and pattern a gate electrode 76a as shown in FIG. 8E. Thereafter, the resist mask is removed. By using the gate electrode 76a and field oxide film 74 as a mask, P ions are implanted to form source/drain regions (refer to FIG. 7).

Figure 8F:
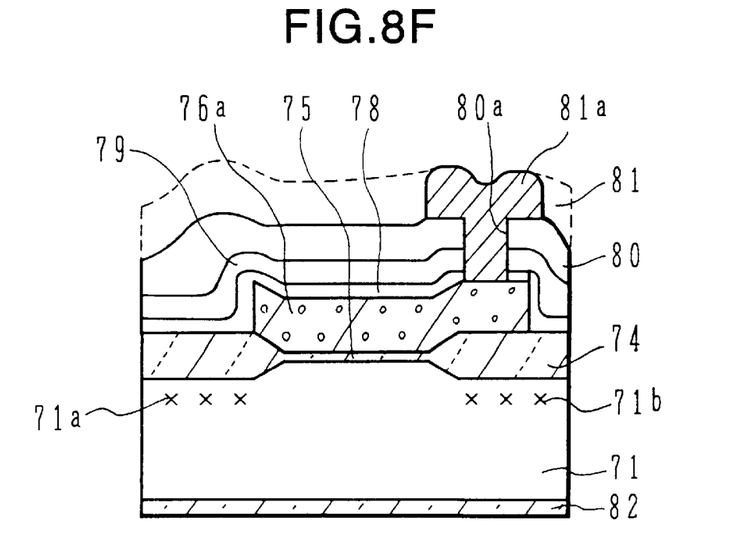

As shown in FIG. 8F, the Si substrate is subjected to a heat treatment at about 800° C. to lightly oxidize the substrate surface to about 5 nm to thereby form a silicon oxide film 78. Another silicon oxide film 79 is then deposited thereon by CVD to a thickness of about 200 nm.

A boron phosphor silicate glass (BPSG) film 80 is deposited by CVD to a thickness of about 500 nm. The BPSG film 80 is subjected to a reflow process to planarize the surface thereof. A contact hole 80a is formed in the BPSG film 80 and silicon oxide films 79 and 78.

On the BPSG film 80 with the contact hole 80a, an Al film (containing 1% Si) 81 is sputtered and patterned to form a wiring 81a for the gate electrode and other wirings.

Thereafter, the oxide film on the bottom surface of the wafer is removed, and an electrode 82 of a metal such as Al is formed on the bottom surface of the Si substrate.

Instead of depositing the silicon oxide film 77 by CVD to a thickness of 50 nm as shown in FIG. 8E, the substrate may be annealed at about 800° C. In this case, instead of forming the gate electrode 76a by patterning the silicon oxide film 77 and silicon film 76 of polycrystalline silicon or amorphous silicon, only the silicon film 76 of polycrystalline silicon or amorphous silicon is patterned to form the gate electrode.

Because of H$_2$ annealing, the total oxygen concentration at the substrate surface is reduced to ⅕ or less, meaning that the interstitial oxygen concentration is more reduced. Thus, the MOS transistor has a sufficiently high initial breakdown voltage. Furthermore, since the crystal growth conditions are controlled so as to ensure a sufficiently high interstitial oxygen concentration and a sufficiently high precipitation nuclei density, these sufficiently high concentration and density are maintained in the central region of a substrate which is less influenced by H$_2$ annealing.

Hydrogen is used for a highly reducing atmosphere in the above description. Other reducing atmospheres such as a gas containing halogen, for example, HCl, may be used so long as they have a function of removing oxygen atoms migrating to the substrate surface. Similar effects are expected if an oxide film is not formed on a silicon substrate surface. However, if a gas containing halogen is used, the surface of a silicon substrate may be roughened so that there is a possibility of lowering the breakdown voltage of an oxide film such as a gate oxide film. Hydrogen is preferable from this viewpoint.

The present invention has been described in connection with the preferred embodiments. The invention is not limited only to the above embodiments. It is apparent to those skilled in the art that various modifications, substitutions, improvement, combinations and the like can be made without departing from the scope of the appended claims.

I claim:

1. A method of manufacturing a semiconductor device comprising the steps of:

pulling a silicon single crystal ingot from a silicon melt at a pulling speed of about 1.1 mm/min;

slicing a wafer from the ingot;

heating the wafer in a reducing atmosphere; and forming a thermal oxide film on a surface of the wafer wherein the ingot contains interstitial oxygen atoms at concentration of about $1.5 \times 10^{18}$ atoms/cm$^3$ or higher.

2. A method according to claim 1, wherein the reducing atmosphere comprises hydrogen.

3. A method according to claim 1, further comprising the step of forming an electrode on the thermal oxide film.

4. A method according to claim 1, further comprising the step of doping electrically active impurities into a pair of regions in the wafer sandwiching the electrode to form an MOS transistor.

5. A method according to claim 1, wherein the thermal oxide film has a thickness of about 10 nm or less.

6. A method according to claim 1, wherein the ingot contains interstitial oxygen atoms concentration of about $1.6 \times 10^{18}$ atoms/cm$^3$ or higher and the thermal oxide film has a thickness of about 8 nm or less.

7. A method according to claim 1, wherein the ingot contains interstitial oxygen at a concentration is about $1.65 \times 10^{18}$ atoms/cm$^3$ or higher and the thermal oxide film has a thickness of about 6 nm or less.

8. A method according to claim 1, wherein the ingot is pulled from a silicon melt contained in a crucible having a quartz surface.

9. A method according to claim 1 wherein the silicon single crystal ingot pulled from the silicon melt is cooled to 1300° C. in less than 60 minutes.

10. A method of manufacturing a semiconductor device comprising the steps of:

preparing a silicon melt in a crucible having a quartz surface;

pulling a silicon single crystal ingot from the silicon melt, while cooling the pulled single crystal ingot to a temperature lower than 1300° C. in about 30 minutes;

slicing a wafer from the ingot;

heating the wafer in a reducing atmosphere; and forming a thermal oxide film on a surface of the wafer, wherein the crucible is rotated relative to the silicon single crystal ingot in the pulling step at a controlled rate to produce a silicon single crystal ingot having an interstitial oxygen concentration of about $1.5 \times 10^{18}$ atoms/cm$^3$ or more.

11. A method according to claim 10, wherein the pulled silicon single crystal ingot is cooled with argon.

* * * * *